United States Patent
Mochizuki et al.

(10) Patent No.: US 9,478,605 B2
(45) Date of Patent: Oct. 25, 2016

(54) SEMICONDUCTOR DEVICE WITH SIMILAR IMPURITY CONCENTRATION JTE REGIONS

(71) Applicant: HITACHI POWER SEMICONDUCTOR DEVICE, LTD., Hitachi-shi, Ibaraki (JP)

(72) Inventors: Kazuhiro Mochizuki, Tokyo (JP); Hidekatsu Onose, Tokyo (JP); Norifumi Kameshiro, Tokyo (JP); Natsuki Yokoyama, Tokyo (JP)

(73) Assignee: Hitachi Power Semiconductor Device, Ltd., Ibaraki (JP)

( * ) Notice: Subject to any disclaimer, the term of this patent is extended or adjusted under 35 U.S.C. 154(b) by 0 days.

(21) Appl. No.: 14/768,173

(22) PCT Filed: Dec. 10, 2013

(86) PCT No.: PCT/JP2013/083101
§ 371 (c)(1),
(2) Date: Aug. 14, 2015

(87) PCT Pub. No.: WO2014/136344
PCT Pub. Date: Sep. 12, 2014

(65) Prior Publication Data
US 2016/0005810 A1 Jan. 7, 2016

(30) Foreign Application Priority Data
Mar. 5, 2013 (JP) .................................. 2013-042492

(51) Int. Cl.
*H01L 29/06* (2006.01)
*H01L 29/861* (2006.01)
(Continued)

(52) U.S. Cl.
CPC ....... *H01L 29/0619* (2013.01); *H01L 21/0495* (2013.01); *H01L 29/06* (2013.01);
(Continued)

(58) Field of Classification Search
CPC ........... H01L 29/0634; H01L 29/0692; H01L 29/6606; H01L 29/872; H01L 29/12; H01L 29/66143; H01L 29/66068; H01L 29/66128; H01L 29/66659; H01L 29/7835; H01L 29/8611; H01L 29/0615; H01L 21/265; H01L 21/0465; H01L 21/266
USPC ............................. 257/76, 288, 472, 492, 77
See application file for complete search history.

(56) References Cited

U.S. PATENT DOCUMENTS 6,002,159 A 12/1999 Bakowski et al.
7,649,213 B2 1/2010 Hatakeyama et al.
(Continued)

FOREIGN PATENT DOCUMENTS

JP 7-193018 A 7/1995
JP 2000-516767 A 12/2000
(Continued)

OTHER PUBLICATIONS

Kaji, Naoki, et al.; "Design and Fabrication of 20 Kv-class SiC PiN Diodes with Space-Modulated JTE", Proceedings of the 73rd Conference of the Japan Society of Applied Physics (2012 Autumn Ehime University / Matsuyama University) 12p-H7-6.
(Continued)

Primary Examiner — Selim Ahmed
(74) Attorney, Agent, or Firm — Miles & Stockbridge P.C.

(57) ABSTRACT

A highly reliable semiconductor device with high withstand voltage is provided. As means therefor, an impurity concentration in a first JTE region is set to $4.4 \times 10^{17}$ cm$^{-3}$ or higher and $6 \times 10^{17}$ cm$^{-3}$ or lower and an impurity concentration in a second JTE region is set to $2 \times 10^{17}$ cm$^{-3}$ or lower in a case of a Schottky diode, and an impurity concentration in the first JTE region is set to $6 \times 10^{17}$ cm$^{-3}$ or higher and $8 \times 10^{17}$ cm$^{-3}$ or lower and an impurity concentration in the second JTE region is set to $2 \times 10^{17}$ cm$^{-3}$ or lower in a case of a junction barrier Schottky diode.

6 Claims, 5 Drawing Sheets

(51) Int. Cl.
*H01L 29/872* (2006.01)
*H01L 21/04* (2006.01)
*H01L 29/66* (2006.01)
*H01L 29/47* (2006.01)
*H01L 29/36* (2006.01)
*H01L 29/16* (2006.01)

(52) U.S. Cl.
CPC ........... H01L29/0615 (2013.01); H01L 29/36 (2013.01); H01L 29/47 (2013.01); H01L 29/6606 (2013.01); H01L 29/8611 (2013.01); H01L 29/872 (2013.01); *H01L 29/1608* (2013.01)

(56) References Cited

U.S. PATENT DOCUMENTS

| | | |
|---|---|---|
| 8,258,052 B2 | 9/2012 | Okuno et al. |
| 8,669,561 B2 | 3/2014 | Hatakeyama |
| 8,716,717 B2 | 5/2014 | Kawakami et al. |
| 2009/0212301 A1 | 8/2009 | Zhang et al. |
| 2013/0140582 A1* | 6/2013 | Kawakami .......... H01L 29/0634 257/76 |

FOREIGN PATENT DOCUMENTS

| | | |
|---|---|---|
| JP | 2006-100593 A | 4/2006 |
| JP | 2008-103529 A | 5/2008 |
| JP | 2011-514674 A | 5/2011 |
| JP | 2011-165856 A | 8/2011 |
| JP | 2012-190983 A | 10/2012 |
| WO | WO2012/049872 A1 | 4/2012 |

OTHER PUBLICATIONS

Pérez, Raúl, et al.; "Planar Edge Termination Design and Technology Considerations for 1.7-Kv 4H-SiC PiN Diodes", IEEE Transactions on Electron Devices, vol. 52, No. 10, pp. 2309-2316, Oct. 2005.

Mochizuki, Kazuhiro, et al.; "Dual-Pearson Approach to Model Ion-Implanted Al Concentration Profiles for High-Precision Design of High-Voltage 4H-SiC Power Devices", Materials Science Forum vols. 600-603 (2009), pp. 607-610.

* cited by examiner

SEMICONDUCTOR DEVICE WITH SIMILAR IMPURITY CONCENTRATION JTE REGIONS

TECHNICAL FIELD

The present invention relates to a semiconductor device.

BACKGROUND ART

Non-Patent Document 1 discloses a vertical p-n diode in which a JTE (Junction Termination Extension) region formed in a termination region of the diode is separated into two regions by using two implantation doses.

The vertical p-n diode described in the Non-Patent Document 1 includes a vertical p-n junction structure made up of an $n^+$-type SiC substrate, an $n^-$-type drift region, a $p^+$-type main junction, a cathode electrode and an anode electrode and a termination structure provided with a JTE region made up of a ring-shaped first JTE region (high concentration implantation region) and a ring-shaped second JTE region (low concentration implantation region) disposed on the surface of the $n^-$-type drift region.

The first JTE region and the second JTE region described in the Non-Patent Document 1 are formed by multi-stage ion implantation of a p-type impurity such as Al, and the implantation dose ratio therebetween is 3 to 1. Further, though not described in the Non-Patent Document 1, according to the presentation at the meeting, the maximum implantation energy is 700 keV in both of the first JTE region and the second JTE region.

Non-Patent Document 2 discloses that an impurity concentration of a first JTE region is $2\times10^{19}$ cm$^{-3}$ and an impurity concentration of a second JTE region is $2\times10^{18}$ cm$^{-3}$ or $2\times10^{17}$ cm$^{-3}$.

Non-Patent Document 3 discloses that the spread in a depth direction in a concentration distribution of Al which is ion-implanted into SiC depends on an implantation energy.

RELATED ART DOCUMENTS

Non-Patent Documents

Non-Patent Document 1: The proceedings of the 73rd Autumn Meeting of the Japan Society of Applied Physics (Sep. 12, 2012, Ehime University, Matsuyama University) 12p-H7-6
Non-Patent Document 2: "Planar Edge Termination Design and Technology Considerations for 1.7-kV 4H-SiC PiN Diodes", pp. 2309-2316, IEEE TRANSACTIONS ON ELECTRON DEVICES, VOL. 52, NO. 10, OCTOBER 2005
Non-Patent Document 3: Materials Science Forum Vol. 600-603 (2009) pp. 607-610

SUMMARY OF THE INVENTION

Problems to be Solved by the Invention

Since the impurity concentration could not be specified from the description of the Non-Patent Document 1 and the contents of the presentation, an experimental test was carried out with changing the impurity concentration. As a result, it was found that the withstand voltage was insufficient in some cases.

Figure 8:
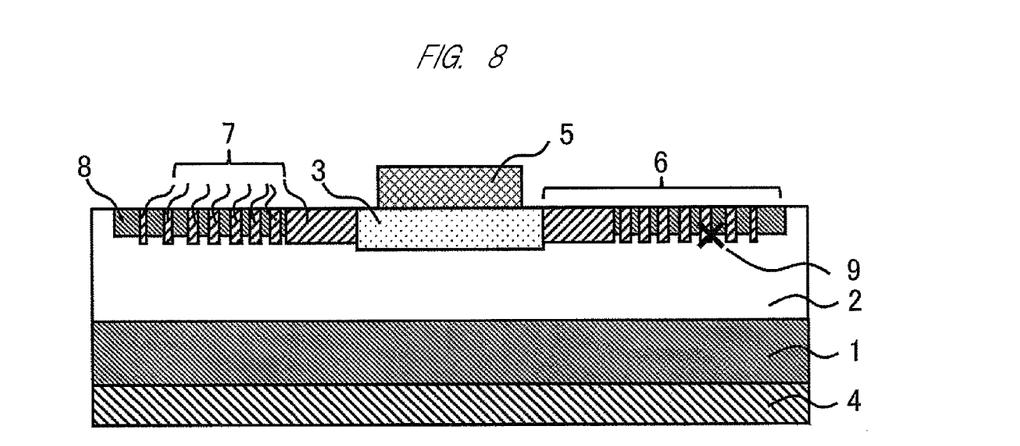
FIG. 8 is a sectional view illustrating a semiconductor device according to the comparative example.

In order to understand the existing phenomenon, the inventors carried out a device simulation test in which the Al ion implantation dose was changed in a range up to $2\times10^{13}$ cm$^{-3}$ disclosed in the Non-Patent Document 1. This revealed that, although an avalanche breakdown occurred near a surface when a surface charge density described in the Non-Patent Document 2 exceeded $7\times10^{12}$ cm$^{-2}$, an avalanche breakdown occurred at a boundary between the first JTE region and the second JTE region (for example, a position indicated by a reference numeral 9 in FIG. 8) in the vicinity of a p-n junction formed between the JTE region and the drift region (typically, at a depth of about 0.7 to 0.9 μm though depending on withstand voltage) when an interfacial charge density was less than $7\times10^{12}$ cm$^{-2}$.

The first JTE region and the second JTE region disclosed in the Non-Patent Document 2 have extremely high impurity concentrations, and the impurity concentration of the first JTE region is ten times higher than that of the second JTE region. Thus, an avalanche breakdown is likely to occur at a boundary between a first JTE region and a second JTE region (for example, a position indicated by a reference numeral 9 in FIG. 8) in a high withstand voltage diode such as a 3.3 kV diode, and this causes the reduction in withstand voltage.

An object of the present invention is to provide a high withstand voltage semiconductor device with high reliability.

Means for Solving the Problem

One means for achieving the object mentioned above is: to make a semiconductor device have a main junction region on a drift region having an n-type conductivity and a p-type JTE region formed adjacently around the main junction region; to provide a first JTE region and a second JTE region having an impurity concentration lower than that of the first JTE region in the JTE region; to provide the first JTE region so as to be sandwiched between the second JTE regions; to set an impurity concentration in the first JTE region to $4.4\times10^{17}$ cm$^{-3}$ or higher and $8\times10^{17}$ cm$^{-3}$ or lower and set an impurity concentration in the second JTE region to $2\times10^{17}$ cm$^{-3}$ or lower in a case of a Schottky diode; and to set an impurity concentration in the first JTE region to $6\times10^{17}$ cm$^{-3}$ or higher and $8\times10^{17}$ cm$^{-3}$ or lower and set an impurity concentration in the second JTE region to $2\times10^{17}$ cm$^{-3}$ or lower in a case of a junction barrier Schottky diode.

Note that it is desirable that a difference in impurity concentration between the first JTE region and the second JTE region at a p-n junction depth is substantially eliminated so that the first JTE region and the second JTE region have almost equal impurity concentration.

It is also desirable that a ratio between width and space of the second JTE regions in an in-plane direction decreases in accordance with a distance from the main junction region.

Effects of the Invention

According to the present invention, it is possible to provide a high withstand voltage semiconductor device with high reliability.

DETAILED DESCRIPTION OF PREFERRED EMBODIMENTS

Embodiments of the present invention will be described below.

First Embodiment

Figure 1:
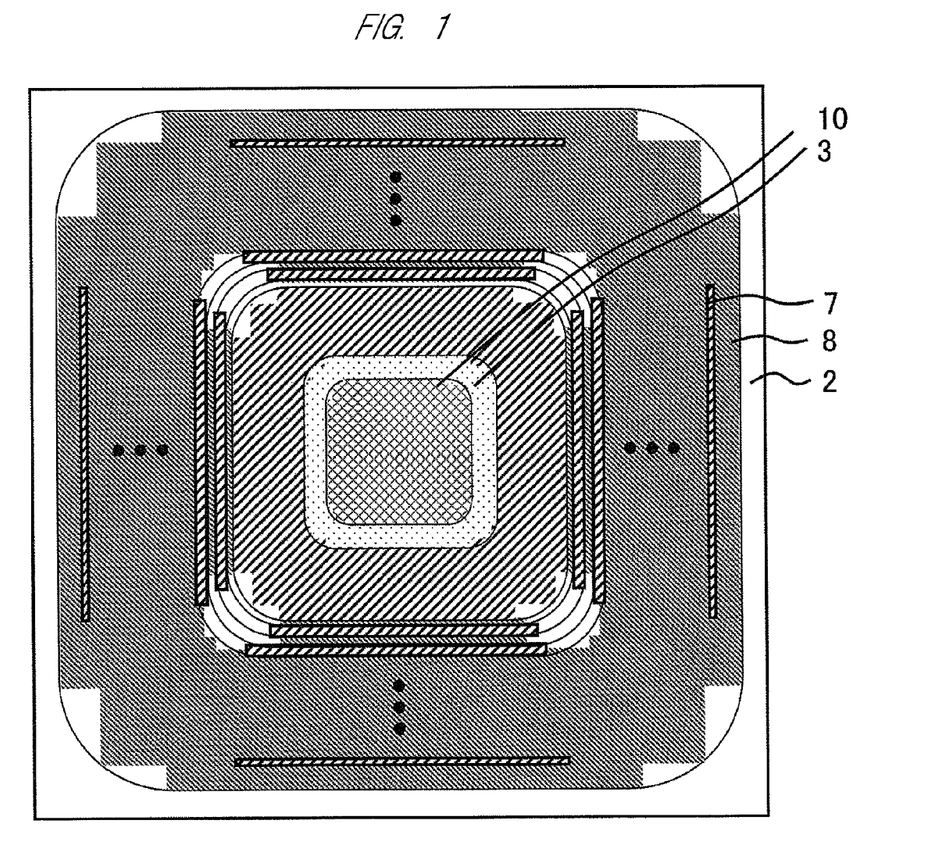
FIG. 1 is a plan view illustrating a semiconductor device according to a first embodiment.
Figure 2:
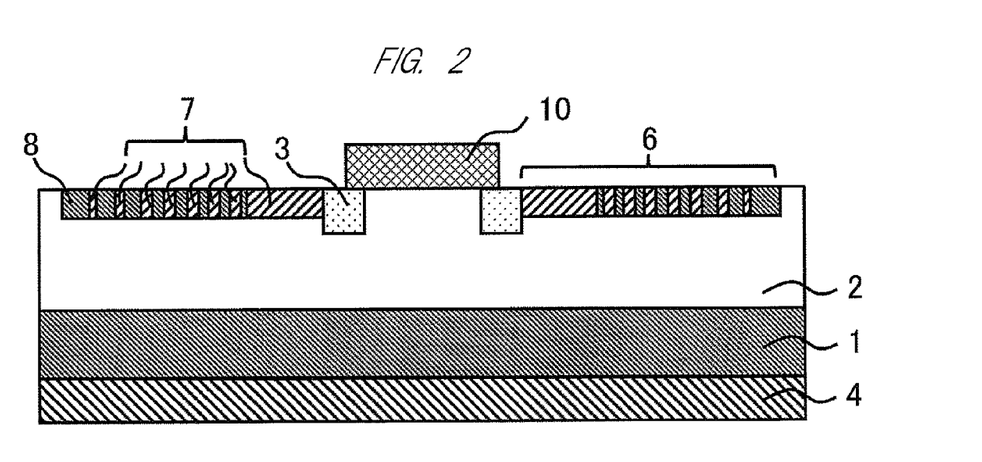
FIG. 2 is a sectional view illustrating the semiconductor device according to the first embodiment.

FIG. 1 is a plan view illustrating a semiconductor device (protective films and others are omitted) according to the first embodiment, and FIG. 2 is a sectional view of the semiconductor device.

The semiconductor device according to the first embodiment is a Schottky diode having an SiC substrate. This semiconductor device includes a drift layer 2 which is an n-type semiconductor region formed on a semiconductor substrate 1 by epitaxial growth, a Schottky electrode 10 formed in a main junction region disposed on an upper surface of the drift layer 2, a p-type semiconductor region 3 implanted with a p-type impurity such as Al and formed as a guard ring around the Schottky electrode 10, and a cathode electrode 4 formed on a rear surface of the semiconductor substrate 1. Further, the semiconductor device includes a JTE (Junction Termination Extension) region 6 constituted of an annular p-type semiconductor region so as to surround the main junction region.

The semiconductor substrate 1 is an n$^+$-type semiconductor substrate which is mainly composed of SiC to which an n-type impurity such as N is implanted at a high concentration.

The drift layer is an n$^-$-type semiconductor layer which is mainly composed of SiC to which an n-type impurity such as N is implanted. The impurity concentration thereof is lower than that of the semiconductor substrate 1.

The JTE region 6 is made up of high impurity density regions (first JTE regions) 7 and low impurity density regions (second JTE regions) 8, and a ratio between width and space of the second JTE regions gradually decreases in a direction from the main junction 3 toward outside.

In the first embodiment, the first JTE region and the second JTE region are formed by multi-stage Al ion implantation using the following ion implantation energies.

First ion implantation energy (first JTE region): 25, 55, 95, 150, 220 and 320 keV.

Second ion implantation energy (first JTE region and second JTE region): 25, 55, 95, 150, 220, 320 and 450 keV.

Figure 5:
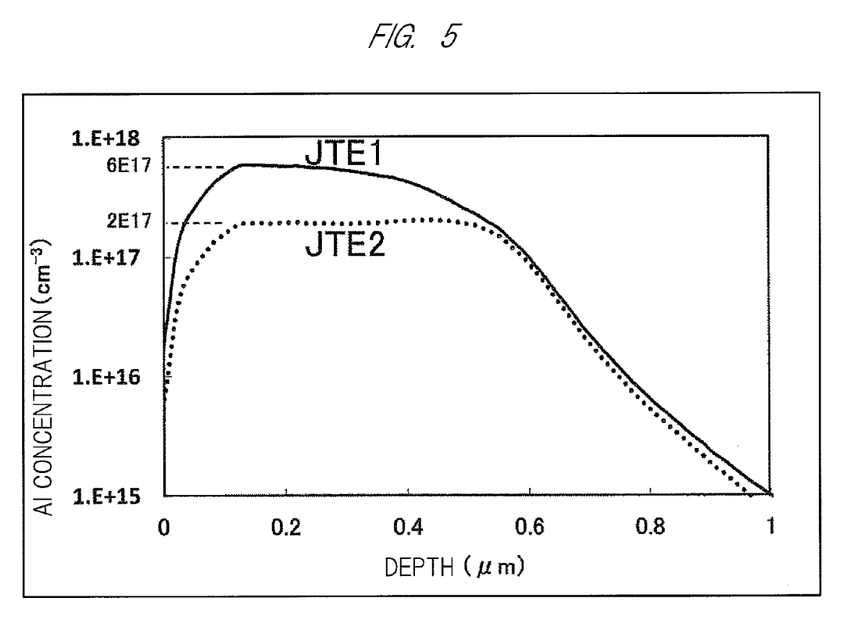
FIG. 5 is a graph illustrating a concentration distribution of Al in a depth direction in a JTE region of the semiconductor device according to the first embodiment and the second embodiment.

The maximum Al concentration (peak setting concentration in box profile) in the first JTE region is set to $6\times10^{17}$ cm$^{-3}$ and the maximum Al concentration of the second JTE region is set to $2\times10^{17}$ cm$^{-3}$, but by making the highest ion implantation energy to a highly doped region (first ion implantation energy) lower than the second ion implantation energy, the difference in concentration between the two regions of the first JTE region and the second JTE region in a horizontal direction at the p-n junction depth becomes almost zero as illustrated by the Al concentration distribution in FIG. 5.

Figure 7:
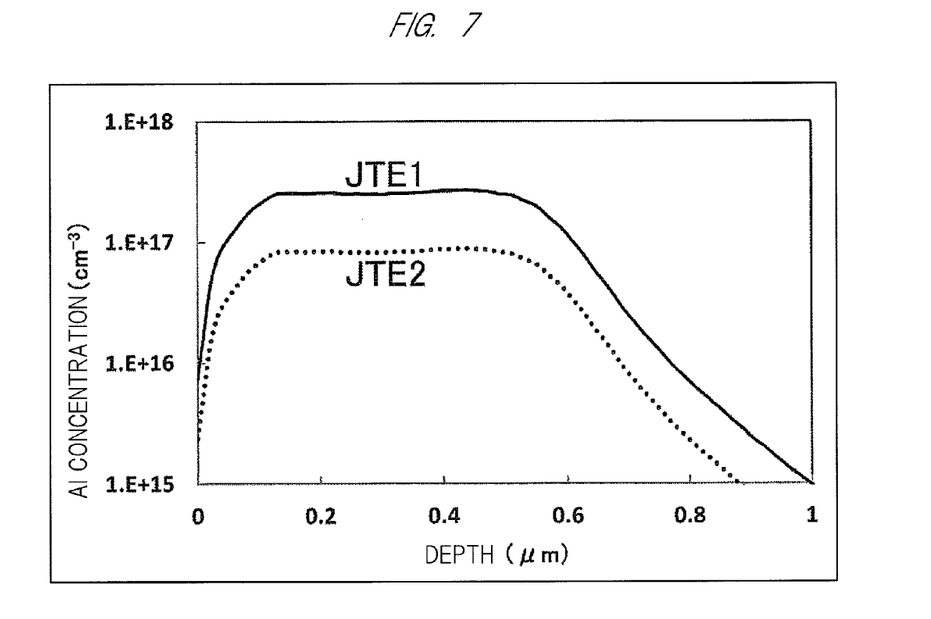
FIG. 7 is a graph illustrating a concentration distribution of Al in a depth direction according to a comparative example.

As a comparative example, FIG. 7 illustrates an Al concentration distribution in a depth direction in the case where the first ion implantation and the second ion implantation are performed with the same implantation energy like the Non-Patent Document 1. In this example, a large discontinuity occurs in the Al concentration distribution in the horizontal direction (substrate in-plane direction) at a depth (depth of 0.7 to 0.9 μm) of a p-n junction formed between the drift layer 2 and the JTE region 6. In particular, unlike the case where the ion implantation energy is set to be as high as 700 keV of the Non-Patent Document 1, when the ion implantation energy is equal to or lower than 450 keV, the Al ion channeling cannot be ignored as disclosed in the Non-Patent Document 3. Specifically, if the Al ion implantation of the first JTE region and the second JTE region is carried out with an implantation dose ratio of 3 to 1 between the first JTE region and the second JTE region like the Non-Patent Document 1 and with the same multi-stage energy having the maximum value of 450 keV or less, the Al concentration sustains its state even at the depth of 0.6 μm or more in a graph of the Al concentration distribution in the depth direction as illustrated in FIG. 7. As a result, the diode having the structure illustrated in FIG. 8 can only acquire the actual withstand voltage of no more than about 70% relative to the ideal withstand voltage in the case where the diode has an infinite size, namely, in the case where there is no peripheral region and the diode can be regarded as one-dimensional structure in the vertical direction.

In contrast, the diode manufactured according to the first embodiment illustrated in FIG. 1 has a withstand voltage that exceeds 90% of the ideal withstand voltage in the case where the diode has an infinite size. This is assumed to be because the concentration setting of the first JTE region and the second JTE region is adjusted and the difference in concentration between the two regions of the first JTE region and the second JTE region in a horizontal direction at the p-n junction depth is made almost zero, so that an electric field is less likely to be concentrated on a boundary between the first JTE region and the second JTE region.

Also, with the maximum Al concentration (peak setting concentration in box profile) in the JTE region of the first embodiment, the field intensity of a protective insulating film (not illustrated in FIG. 2) at the outermost peripheral position of the second JTE region does not exceed 2 MV/cm, and thus the problem of the breakage of the insulating film does not occur in the measurement of initial characteristics.

Furthermore, as a result of the measurement in which the diode was retained at 125° C. for 1000 hours in the state of setting the reverse voltage to 80% of the rated withstand voltage and was then cooled to a room temperature while applying the reverse voltage, the breakage of the Schottky diode by the application of the voltage equal to or lower than an initial withstand voltage was not found at all. This is assumed to be because the maximum concentration of the first JTE region is high and the withstand voltage is thus not deteriorated even under the severe test condition in which the interfacial charge density exceeds $7\times10^{12}$ cm$^{-2}$.

Also, when the maximum Al concentration in the first JTE region was set to $4\times10^{17}$ cm$^{-3}$ and the maximum Al concentration in the second JTE region was set to $2\times10^{17}$ cm$^{-3}$, the withstand voltage of the Schottky diode exceeded 90% of the ideal withstand voltage. However, as a result of the measurement in which the diode was retained at 125° C. for 1000 hours in the state of setting the reverse voltage to 80% of the rated withstand voltage and was then cooled to a room temperature while applying the reverse voltage, the breakage of the Schottky diode by the application of the voltage equal to or lower than an initial withstand voltage was found. The presence of positive charge at the density of about $1\times10^{12}$ cm$^{-2}$ to $2\times10^{12}$ cm$^{-2}$ at an interface between an insulating film and the semiconductor in an initial state has been known in the case of a semiconductor device using SiC, and it is presumed that the interfacial charge varies toward the positive larger value during the test and this reduces the withstand voltage, which causes the breakage of the Schottky diode. When the maximum Al concentration in the first JTE region was set to $6\times10^{17}$ cm$^{-3}$ and the maximum Al concentration in the second JTE region was set to $2\times10^{17}$ cm$^{-3}$ like the first embodiment, the breakage of the Schottky diode was not found at all. Then, another test in which the maximum Al concentration in the first JTE region was increased from $4.0\times10^{17}$ cm$^{-3}$ to $4\times10^{16}$ cm$^{-3}$ in a step-by-step manner while fixing the maximum Al concentration in the second JTE region at $2\times10^{17}$ cm$^{-3}$ was carried out. As a result of the test, it was found that the breakage of the Schottky diode did not occur when the maximum Al concentration in the first JTE region was equal to or higher than $4.4\times10^{17}$ cm$^{-3}$. Furthermore, it was also found that the initial withstand voltage itself was decreased when the maximum Al concentration in the first JTE region was increased to $8.4\times10^{17}$ cm$^{-3}$. Accordingly, in order to achieve a Schottky diode as a semiconductor device with high reliability, the range of the maximum concentration of the first JTE region is desirably from $4.4\times10^{17}$ cm$^{-3}$ to $8\times10^{17}$ cm$^{-3}$.

As described above, according to the first embodiment, it is possible to enhance a withstand voltage of a semiconductor device such as a Schottky diode using SiC, and achieve the semiconductor device with high reliability.

Second Embodiment

Figure 3:
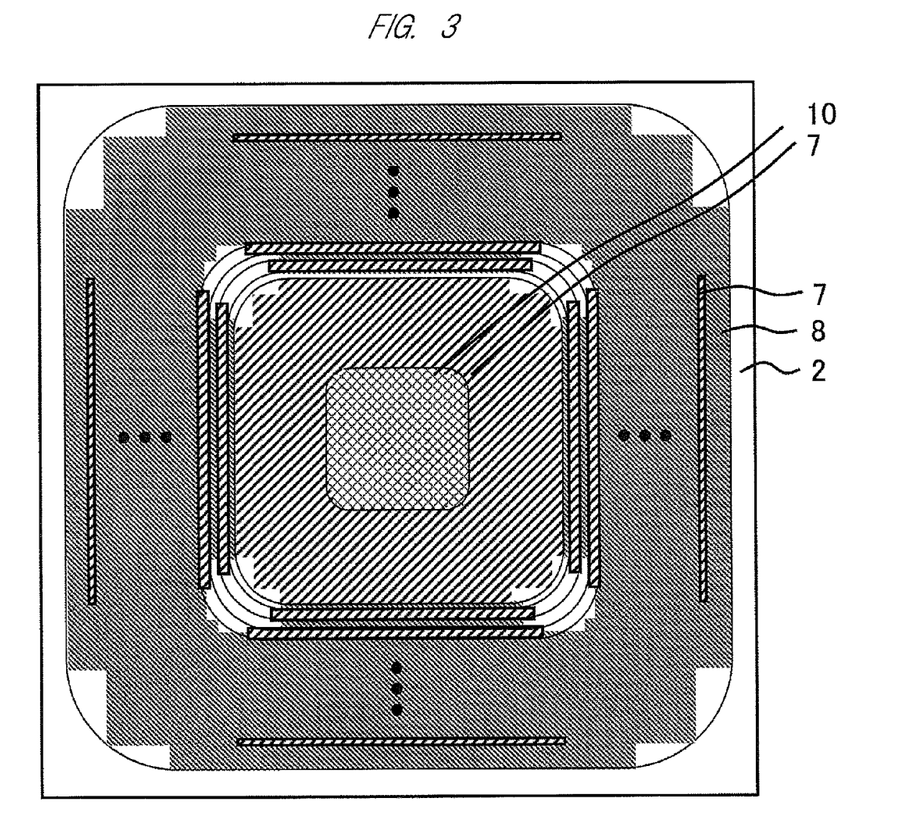
FIG. 3 is a plan view illustrating a semiconductor device according to a second embodiment.
Figure 4:
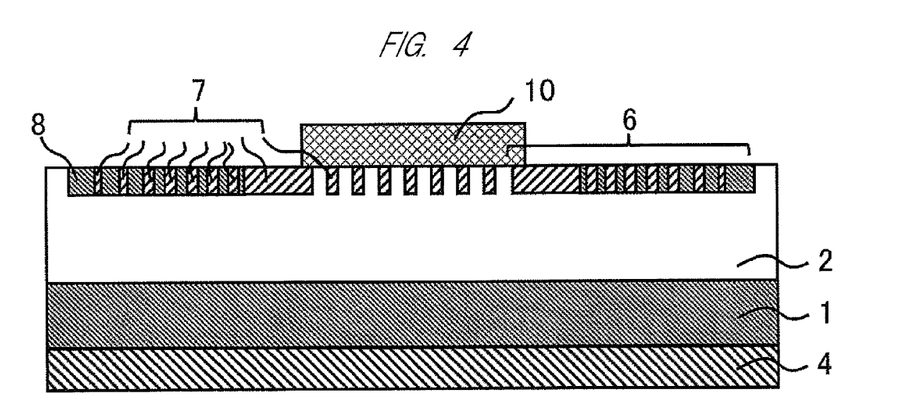
FIG. 4 is a sectional view illustrating the semiconductor device according to the second embodiment.

FIG. 3 is a plan view of a semiconductor device according to the second embodiment, and FIG. 4 is a sectional view of the semiconductor device.

Figure 6:
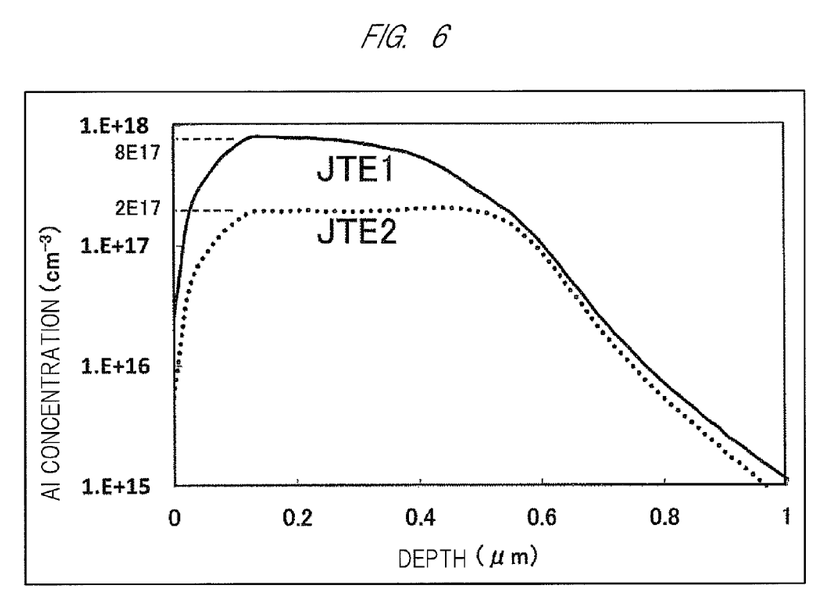
FIG. 6 is a graph illustrating a concentration distribution of Al in a depth direction in a JTE region of a semiconductor device according to the first embodiment and the second embodiment.

The major difference from the first embodiment lies in the point that the first JTE regions are disposed discretely under the Schottky electrode 10 and annularly around the Schottky electrode 10 instead of the p-type semiconductor region 3 used as a guard ring, thereby forming a JBS diode. The implantation energy of the first JTE region and the second JTE region is the same as the first embodiment, and the implantation dose of the first JTE region is controlled so that the maximum Al concentration in the first JTE region has three values such as $4.4\times10^{17}$ cm$^{-3}$ (not illustrated), $6\times10^{17}$ cm$^{-3}$ (FIG. 5) and $8\times10^{17}$ cm$^{-3}$ (FIG. 6) and the implantation dose of the second JTE region is controlled so that the maximum Al concentration in the second JTE region becomes $2\times10^{17}$ cm$^{-3}$ (FIG. 5 and FIG. 6).

In the JBS diode manufactured according to the second embodiment, when the maximum Al concentration in the first JTE region was $4.4\times10^{17}$ cm$^{-3}$, the withstand voltage was decreased to 60% of the ideal withstand voltage in the case where the diode had an infinite size. This is assumed to be because the maximum Al concentration in the first JTE region of $4.4\times10^{13}$ cm$^{-3}$ was too low for the substitute of the p-type semiconductor region 3 of the first embodiment. In contrast, when the maximum Al concentration in the first JTE region was $6\times10^{11}$ cm$^{-3}$ and $8\times10^{17}$ cm$^{-3}$, the withstand voltage exceeded 90% of the ideal withstand voltage in the case where the diode had an infinite size. Then, when the maximum Al concentration in the first JTE region was $6\times10^{17}$ cm$^{-3}$ and $8\times10^{17}$ cm$^{-3}$, the breakage of the JBS diode by the application of the voltage equal to or lower than an initial withstand voltage was not found at all in the measurement in which the diode was retained at 125° C. for 1000 hours in the state of setting the reverse voltage to 80% of the rated withstand voltage and was then cooled to a room temperature while applying the reverse voltage. Accordingly, in order to achieve a JBS diode as a semiconductor device with high reliability, the range of the maximum concentration of the first JTE region is desirably from $6\times10^{17}$ cm$^{-3}$ to $8\times10^{17}$ cm$^{-3}$.

According to the second embodiment, it is possible to achieve a semiconductor device such as a JBS diode using SiC with high reliability and also possible to omit a process of forming the p-type semiconductor region 3 formed as a guard ring in the first embodiment, thereby reducing the manufacturing cost of the semiconductor device.

In the foregoing, the invention made by the inventors of the present invention has been concretely described based on the embodiments. However, it is needless to say that the present invention is not limited to the foregoing embodiments and various modifications and alterations can be made within the scope of the present invention.

REFERENCE SIGNS LIST 1 semiconductor substrate
2 drift region
3 p-type semiconductor region
4 cathode electrode
6 JTE region
7 first JTE region with large implantation dose
8 second JTE region with small implantation dose
9 example of position of avalanche breakdown
10 Schottky electrode

The invention claimed is:
1. A semiconductor device comprising:
a main junction region on a drift region having an n-type conductivity; and
a p-type JTE region formed adjacently around the main junction region,
wherein the JTE region includes a first JTE region and a second JTE region each having a substantially equal impurity concentration in a vicinity of a junction depth,
wherein the first JTE region is disposed so as to be sandwiched between the second JTE regions, and
wherein an impurity concentration in the first JTE region is set to $4.4\times10^{17}$ cm$^{-3}$ or higher and $8\times10^{17}$ cm$^{-3}$ or lower and an impurity concentration in the second JTE region is set to $2\times10^{17}$ cm$^{-3}$ or lower in a case of a Schottky diode.
2. The semiconductor device according to claim 1, wherein a difference in impurity concentration between the first JTE region and the second JTE region at a p-n junction depth is substantially zero.
3. The semiconductor device according to claim 1, wherein a ratio between width and space of the second JTE regions decreases in accordance with a distance from the main junction region.
4. A semiconductor device comprising:
a main junction region on a drift region having an n-type conductivity; and a p-type JTE region formed adjacently around the main junction region, wherein the JTE region includes a first JTE region and a second JTE region each having a substantially equal impurity concentration in a vicinity of a junction depth, wherein the first JTE region is disposed so as to be sandwiched between the second JTE regions, and wherein an impurity concentration in the first JTE region is set to $6 \times 10^{17}$ cm$^{-3}$ or higher and $8 \times 10^{17}$ cm$^{-3}$ or lower and an impurity concentration in the second JTE region is set to $2 \times 10^{17}$ cm$^{-3}$ or lower in a case of a junction barrier Schottky diode.

5. The semiconductor device according to claim 4, wherein a difference in impurity concentration between the first JTE region and the second JTE region at a p-n junction depth is substantially zero.

6. The semiconductor device according to claim 4, wherein a ratio between width and space of the second JTE regions decreases in accordance with a distance from the main junction region.

* * * * *